(12) United States Patent
Mohindra et al.

(10) Patent No.: US 6,169,463 B1
(45) Date of Patent: Jan. 2, 2001

(54) QUADRATURE MODULATOR WITH SET-AND-FORGET CARRIER LEAKAGE COMPENSATION

(75) Inventors: Rishi Mohindra, Milpitas; Petrus M. Stroet, Sunnyvale, both of CA (US)

(73) Assignee: Philips Electronic North America Corp., New York, NY (US)

( * ) Notice: Under 35 U.S.C. 154(b), the term of this patent shall be extended for 0 days.

(21) Appl. No.: 09/275,368

(22) Filed: Mar. 24, 1999

(51) Int. Cl.$^7$ .................................................. H03C 3/00
(52) U.S. Cl. .................... 332/104; 332/103; 332/160; 332/161; 332/162; 375/261; 375/298; 455/63; 455/115
(58) Field of Search .................... 332/104, 103, 332/123, 162, 167, 124, 160, 161; 375/298, 261; 455/46, 63, 109, 119, 115

(56) References Cited

U.S. PATENT DOCUMENTS

| | | | |
|---|---|---|---|
| 5,012,208 | 4/1991 | Makinen et al. | 332/103 |
| 5,396,196 | 3/1995 | Blodgett | 332/162 |
| 5,793,817 | * 8/1998 | Wilson | 375/297 |

FOREIGN PATENT DOCUMENTS 07202961A   8/1995   (JP) ........................ H04L/27/20

* cited by examiner

*Primary Examiner*—Robert Pascal
*Assistant Examiner*—Kimberly Glenn

(57) ABSTRACT

A quadrature modulator with set-and-forget carrier leakage compensation. The quadrature modulator comprises an in-phase and a quadrature branch. In the in-phase and quadrature branches, real-time digital signals are converted to analog signals, the analog signals are filtered, and the filtered analog signals are modulated with a carrier signal and a ninety degrees phase shifted version of the carrier, respectively. The modulated in-phase and quadrature signals are added so as to form a quadrature amplitude modulated signal. Preferably upon powering up of the quadrature modulator, in the in-phase and quadrature branches, carrier leakage is measured. The measured carrier leakage is supplied to comparators, which toggle, when carrier leakage is minimal in the respective in-phase and quadrature branches. Upon powering up of the quadrature modulator, the state machine starts signal generators which inject compensation signals into the in-phase and quadrature branches, respectively, so that dc-offsets in the in-phase and quadrature branches are reduced, thereby reducing the carrier leakage in the in-phase and quadrature branches. When the comparators toggle, the state machine is commanded to stop controlling the corresponding signal generators of which output signals are then frozen.

14 Claims, 4 Drawing Sheets

QUADRATURE MODULATOR WITH SET-AND-FORGET CARRIER LEAKAGE COMPENSATION

BACKGROUND OF THE INVENTION

1. Field of the Invention

The present invention relates to a quadrature modulator.

The present invention further relates to a radio communication device comprising a quadrature modulator, and to a modulation method.

2. Description of Related Art

In the U.S. Pat. No. 5,012,208 a quadrature modulator is disclosed with adaptive suppression of carrier leakage in an in-phase and a quadrature branch of the quadrature modulator. By applying an appropriate dc-offset (direct current) to the in-phase and quadrature branches, such a carrier leakage can be substantially eliminated, when initially adjusting the quadrature modulation, and selecting matching components. It is described that many factors, such as temperature, frequency, load impedance, and carrier power variations may not be adequate to compensate for carrier leakage. In said U.S. Pat. No. 5,012,208 a complicated control loop is disclosed for adaptively adjusting the local oscillator's leak signal to the output of the rf-mixer, such a control loop having correlators and integrators in its feedback paths. At an output of an rf-power amplifier, which is coupled to the quadrature modulator, the control loop continuously measures and correlates the rf-power to be transmitted, and, in dependence thereto, continuously injects dc-offset compensation values at input side of the quadrature modulator.

In the U.S. Pat. No. 5,396,196 a similar type of carrier leakage compensation as in said U.S. Pat. No. 5,012,208 is disclosed. In addition thereto, the carrier leakage compensation control loop described therein needs a complicated Pseudo-Noise generator.

In the Japanese Abstract No. 07202961, in a transmitter with a quadrature modulator, a carrier leakage compensation circuit is disclosed. A dc-level detector measures dc-levels at a base band side of the quadrature modulator. On the basis of such measured base band dc-offset signals, an adjusting circuit adjusts dc-levels of the base band quadrature signals.

SUMMARY OF THE INVENTION

It is an object of the invention to provide a quadrature modulator with a simple but robust carrier leakage compensation means.

It is another object of the invention to provide a quadrature modulator in which carrier leakage compensation is performed at predetermined instants.

It is still another object of the invention to provide a quadrature modulator in which possible dc-offsets or other disturbing effects generated by compensation means itself are eliminated.

It is yet another object of the invention to easily control application of carrier leakage compensation.

It is yet another object of the invention to eliminate effects of cross talk.

In accordance with the invention, a quadrature modulator is provided comprising:

an in-phase quadrature modulation branch comprising a first series arrangement of a first digital-to-analog converter, a first anti-aliasing filter, a first summing means, and a first mixer;

a quadrature modulation branch comprising a second series arrangement of a second digital-to-analog converter, a second anti-aliasing filter, a second summing means, and a second mixer;

a local oscillator means for providing a first local oscillator signal and a second local oscillator signal to said first and second mixers, respectively;

a third summing means coupled to respective outputs of said first and second mixers, said third summing means providing a quadrature modulated signal;

carrier leakage measurement means for measuring a first carrier leakage signal of said first local oscillator signal in said in-phase modulation branch, and a second carrier leakage signal of said second local oscillator signal in said quadrature branch;

a controllable signal generating means for generating a first monotonously increasing signal and a second monotonously increasing signal; and holding means for holding values of said first and second monotonously increasing signals, said holding means being coupled to said first and second summing means so as to form feedback paths;

said carrier leakage measurement means adopting a first state in which said first and second carrier leakage signals are measured, and a second state in which said controllable signal generating means is controlled to stop generating said first and second monotonously increasing signals, said second state being adopted from said first state during measurement of said first and second carrier leakage signals.

The invention is based upon the insight that usually parameters influencing carrier leakage are slowly varying with time so that there is no need for continuous compensation. Based upon this insight, it was realized that a simple but robust carrier leakage compensation could be implemented being operative at predetermined points in time, such at switching on power, or, when used in a communications apparatus, possibly also at channel switching. When used in a communication device such as a broad band CDMA communications device, in which, in principle, no channel switching is needed, there is only a needed to apply carrier leakage compensation at power on of the communications device. In such a case, after power on, power to components used for carrier leakage compensation could even be switched off, thus achieving power savings in such a portable communications device.

Preferably, said carrier leakage detection means comprises a first series arrangement of a first synchronous detector and a first comparator, and a second series arrangement of a second synchronous detector and a second comparator, respective output signals of said first and second comparators controlling said controllable signal generating means to stop generating said first and second monotonously increasing signals. Herewith, carrier leakage is accurately measured, while at the same time a well-defined criterion is available for stopping carrier leakage compensation.

Preferably, said controllable signal generating means comprises a first counter, and a first state machine coupled between said carrier leakage measurement means, and a second counter, and a second state machine coupled between said carrier leakage measurement means, said first and second state machines feeding clock pulses to said first and second counters when said carrier leakage means is in said first state, and stopping to feed clock pulses to said counter when said carrier leakage means is in said second state. Herewith, a very simple means is obtained for digitally generating a controllable amount of dc-offset compensation, until the carrier leakage measurement means stop the dc-offset compensation.

For simply injecting an analog dc-compensation signal representing the digitally generated compensation, digitalto-analog converters are provided. Filters are provided for filtering double frequency carrier components that are introduced by synchronous detectors included in the measurement means. Before these synchronous detectors, amplifiers are provided to suppress dc-offsets introduced by the synchronous detectors, the synchronous detectors otherwise introducing additional carrier leakage.

DESCRIPTION OF THE PREFERRED EMBODIMENT

Figure 1:
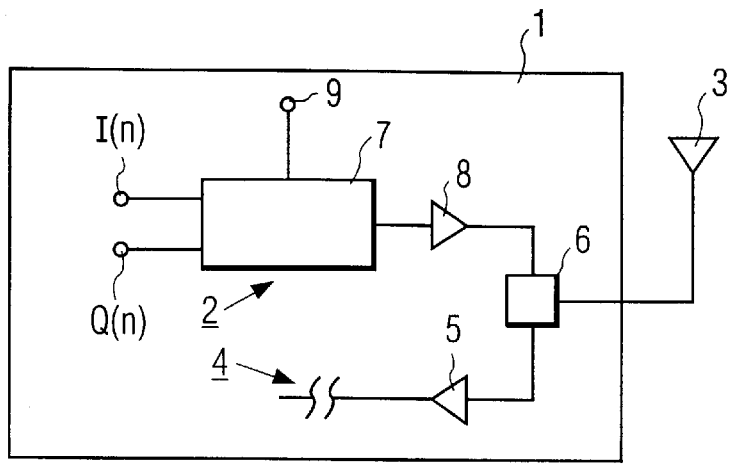
FIG. 1 schematically shows a block diagram of a radio communication device.

Throughout the figures, the same reference numerals are used for the same features.

FIG. 1 schematically shows a block diagram of a radio communication device 1. The radio communication device 1 comprises at least a transmitter 2, which is coupled to an antenna 3. In case the radio communication device 1 is a transceiver, the radio communication device 1 further comprises a receiver 4 of which only a low-noise amplifier 5 is shown, and a duplexer 6, or any other suitable device, for coupling the transmitter 2 and the receiver 4 to the antenna 3. The transmitter 2 comprises a quadrature modulator 7, and a power amplifier 8 coupled between the quadrature modulator 7 and the antenna 3. Such transceiver architecture as such is well known in the art. The shown transceiver can be a cellular radio transceiver, in an FD/TDMA system, in a CDMA system, in a cordless telephony system, or any other suitable system. Input signals to the quadrature modulator 7 are real time digital signals I(n) and Q(n), to be supplied to an in-phase and a quadrature branch of the quadrature modulator, respectively, n being an integer indication bits, chips or symbols to be modulated. The quadrature modulator 7 comprises a power control input 9 via which selective parts of the quadrature modulator can be powered down, powering down of selective parts of a circuit as such being well-known in the art of electronic circuits.

Figure 2:
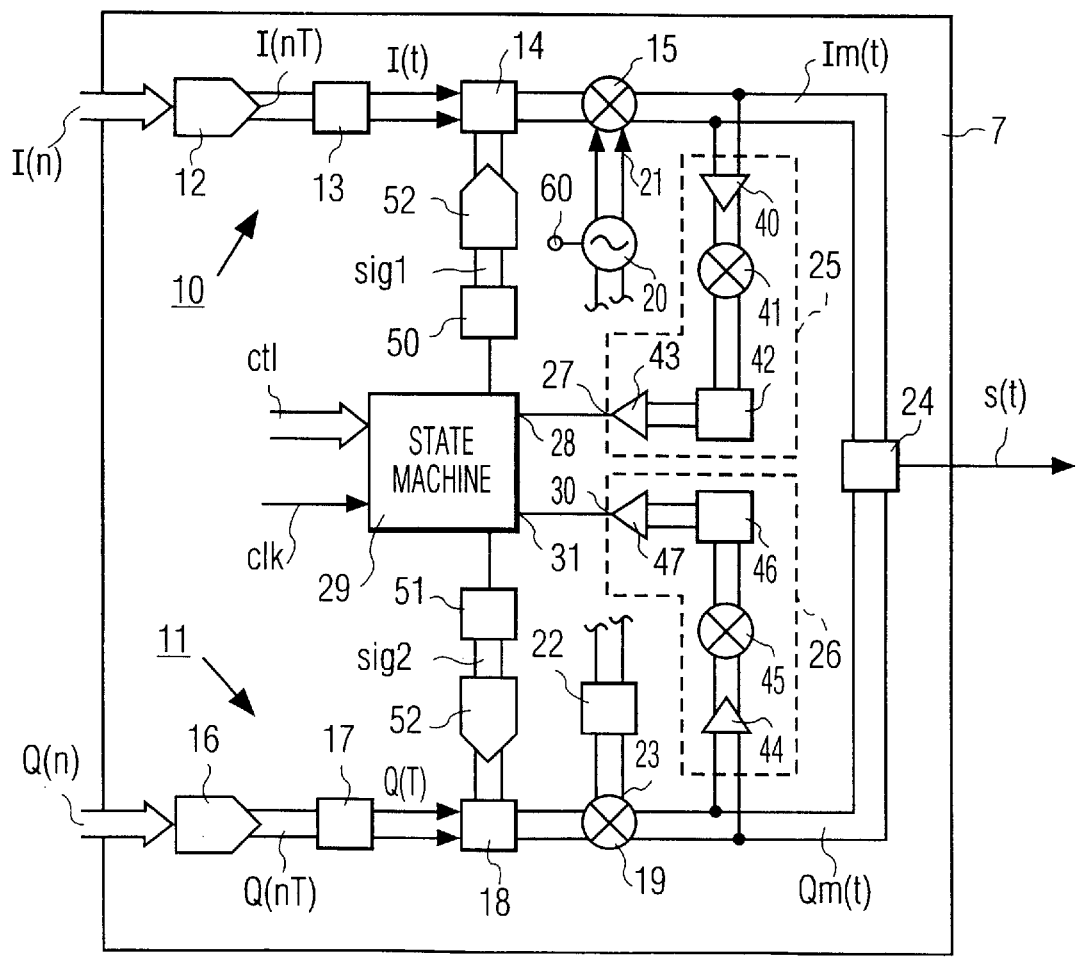
FIG. 2 is a block diagram of a first embodiment of a quadrature modulator according to the present invention.

FIG. 2 is a block diagram of a first embodiment of the quadrature modulator 7 according to the present invention. The quadrature modulator 7 comprises an in-phase modulation branch 10 and a quadrature modulation branch 11. The in-phase modulation branch 10 comprises a first series arrangement of a first digital-to-analog converter 12, a first anti-aliasing filter 13, a first summing means 14, and a first mixer 15, and the quadrature modulation branch 11 comprises a second series arrangement of a second digital-to-analog converter 16, a second anti-aliasing filter 17, a second summing means 18, and a second mixer 19. The analog-to-digital converter 12 provides a reconstructed signal I(nT), T being a reconstruction period. The anti-aliasing filter 13 provides a filtered analog signal I(t). Similarly, in the quadrature branch 11, the digital-to-analog converter 16 provides a reconstructed signal Q(nT), and the anti-aliasing filter 17 provides a filtered analog signal Q(t). The quadrature modulator 7 further comprises a local oscillator 20, which is coupled to a differential input 21 of the first mixer 15, and through a ninety degrees phase shifting device 22 to a differential input 23 of the second mixer 19. The local oscillator 20 provides a carrier signal to the in-phase and quadrature mixers 15 and 19. The quadrature modulator 7 further comprises summing means 24 for summing mixed quadrature modulator signals Im(t) and Qm(t). The quadrature modulator provides a quadrature amplitude modulated output signal s(t). In accordance with the present invention, the quadrature modulator 7 further comprises carrier leakage measurement means for measuring a first carrier leakage signal in the signal Im(t) and for measuring a second carrier leakage signal in the signal Qm(t), the carrier leakage measurement means comprising a first series arrangement 25, and a second series arrangement 26, the first series arrangement 25 being coupled to the in-phase branch 10 and the second series arrangement 26 being coupled to the quadrature branch 11, in the example given to respective outputs of the mixers 15 and 16. An output 27 of the first series arrangement 25 is coupled to an input 28 of a state machine 29, and an output 30 of the second series arrangement 26 is coupled to an input 31 of the state machine 29. The first series arrangement 25 is a series arrangement of a first amplifier 40, a first synchronous detector 41, a first filter 42, and a first comparator 43. The second series arrangement 26 is a series arrangement of a second amplifier 44, a second synchronous detector 45, a second filter 46, and a second comparator 47. Further inputs to the state machine 29 are a control signal ctl and a system clock signal clk. At output side, the state machine 29 is coupled to controllable signal generating means for generating a first monotonously increasing signal sig1 and a second monotonously increasing signal sig2, to be subtracted from the signals filtered analog signals I(t) and Q(t), respectively. In more detail, the controllable signal generating means comprises a first counter 50 and a second counter 51, the first and second counters 50 and 51 being controlled by the state machine 29. The quadrature modulator 7 further comprises holding means for holding values of the signals sig1 and sig2, the holding means comprising a third digital-to-analog converter 52 for holding the value of the signal sig1, and a fourth digital-to-analog converter 53 for holding the signal sig2. In the shown quadrature modulator 7, the local oscillator 20 is tunable by a tuning control input 60. As regards carrier leakage compensation, the quadrature modulator 7 of the present invention can be characterized as a set-and-forget quadrature modulator. In principle, the quadrature leakage is measured at powering up of the quadrature modulator 7 or radio communication device 1, and the quadrature leakage compensation is done once. If need be, however, the compensation can also be done at other instants, when tuning from one channel to another, for instance.

In order not to introduce dc-offsets from the modulation branches 10 and 11, digital input signals to the branches 10 and 11 are set to zero. Preferably, during carrier leakage compensation, the power amplifier 8 is switched off so as to prevent transmission of an unmodulated carrier.

The operation of the set-and-forget carrier leakage in the quadrature modulator 7 is as follows. Upon powering up of the quadrature modulator 7, the first and second synchronous detectors 41 and 45 measure the carrier leakage in the in-phase and quadrature branches 10 and 11, while at the same time the state machine 29 initiates the first and second counters 50 and 51 so that the monotonously increasing signals sig1 and sig2 are subtracted from the filtered analog signals I(t) and Q(t), respectively. Feedback paths are thus provided for carrier leakage reduction. When carrier leakage in the in-phase and quadrature branches 10 and 11 is minimal, the comparators 43 and 47 toggle, respectively, commanding the state machine 29 to stop the counters 50 and 51 so that the digital-to-analog converters 52 and 53 hold the current values of the counters 50 and 51, respectively.

Figure 3:
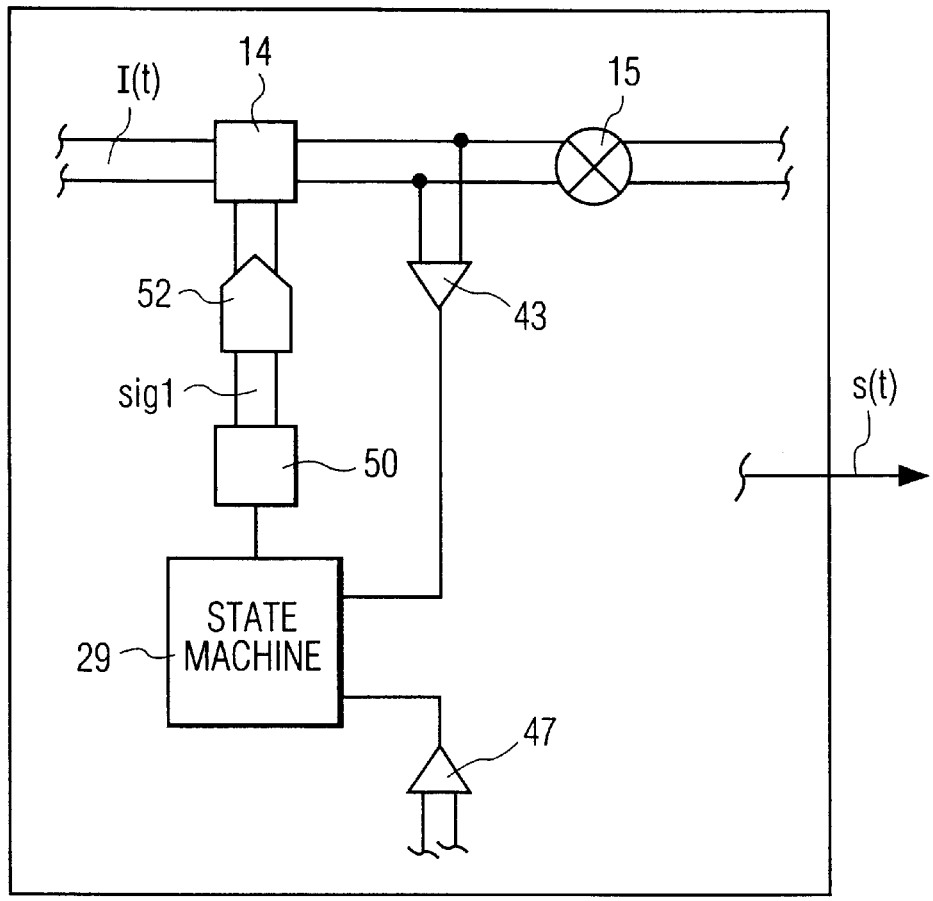
FIG. 3 is a block diagram of a second embodiment of a quadrature modulator according to the present invention.

FIG. 3 is a block diagram of a second embodiment of the quadrature modulator 7 according to the present invention. In this very simple embodiment of a set-and-forget carrier offset compensation, only dc-offset compensation for the filters 13 and 17 is obtained. In this embodiment, the comparators 43 and 47 should exhibit a much lower dc-offset than the filters 13 and 17. Instead of branching off in the in-phase and quadrature branches, the carrier leakage measurement means can branch off the output signal s(t). Then, a single control signal controls the state machine 29 to stop injection of compensation signals in both the in-phase and quadrature branches 10 and 11. To save pin counts, the outputs 27 and 30 of the comparators 43 and 47 can be multiplexed.

Figure 4:
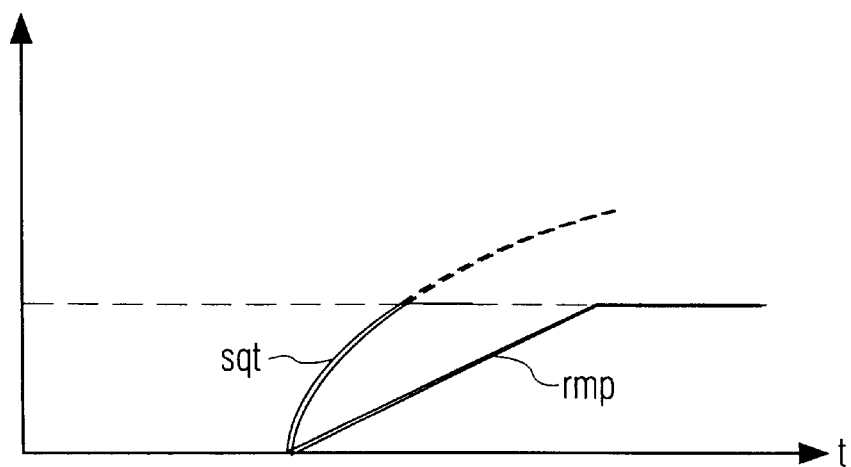
FIG. 4 shows generator signals for use in a quadrature modulator according to the present invention.

FIG. 4 shows generator signals for use in the quadrature modulator 7 according to the present invention. Preferably, the controllable signal generating means is comprised of the counters 50 and 51, a simple digital implementation of the present invention. In such an embodiment, the counters 50 and 51 are started by the state machine 29, the compensation signals sig1 and sig2 being ramp signals rmp as shown in FIG. 4. Other monotonously increasing compensation signals can be applied, such as a shown square root signal sqt. Such a square root signal exhibits a steeper slope when starting up the carrier leakage compensation. Herewith the overall compensation process is faster. Digital signal generators for generating square root signals as such are well known in the art. Instead of applying digital generators as described, controllable analog signal generators can be applied as well, although there is a considerable risk that the set-and-forget compensation signal runs away, i.e., is not stable in the long run. As a hold means, capacitive hold means could be used, alternatively.

Figure 5:
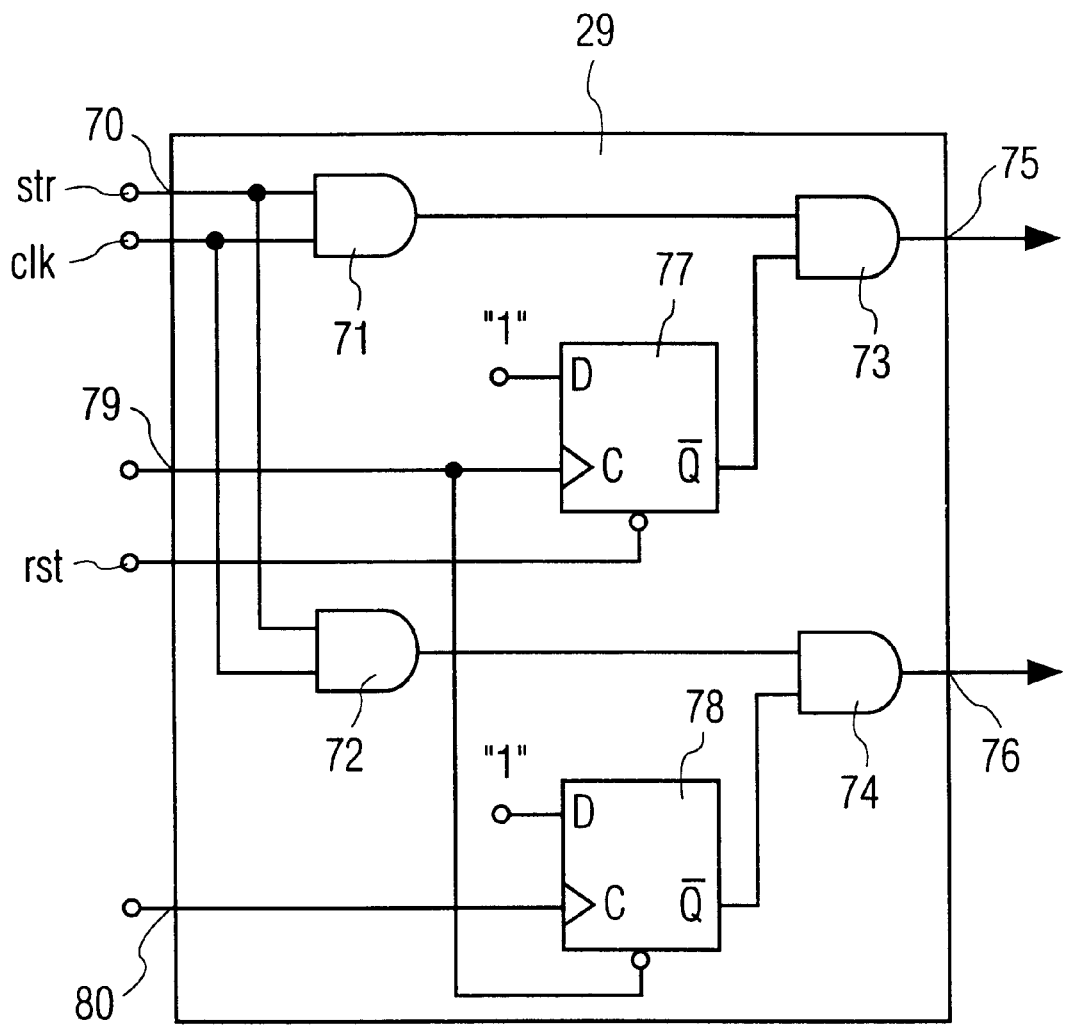
FIG. 5 shows a state machine for use in a quadrature modulator according to the present invention.

FIG. 5 shows the state machine 29 for use in the quadrature modulator 7 according to the present invention. The state machine 29 comprises an input 70 for a start/stop control signal str of the system clock clk. To this end, both the start/stop control signal str and the system clock signal clk are input to respective AND-gates 71 and 72 for in-phase and quadrature branch injection control of the compensation signals. If the start/stop signal str has a logic "0" value, the AND-gates 71 and 72 block the system clock clk so that the counters 50 and 51 do not receive further clock pulses and thus preserve their current values. If the start/stop signal str has a logic "1" value, the system clock is passed to respective further AND-gates 73 and 74 of which outputs 75 and 76 are coupled to the counters 50 and 51, respectively. Herewith, the counters 50 and 51 generate a ramp signal while being clocked. The state machine 29 further comprises a first negative edge triggered D-flip flop 77 for in-phase branch counter control, and a second negative edge triggered D-flip flop 78 for quadrature branch counter control. Output signals of the comparators 43 and 47 are supplied to clock inputs 79 and 80, respectively, of the D-flip flops 77 and 78. If the comparators 43 and 47 toggle, at minimum carrier leakage, negative edges are generated, clocking the D-flip flops so that the inverse of the logic "1" appears at the inverse Q-output, i.e., a logic "0" blocking the AND-gates 73 and 74, as the case may be. Herewith, the system clock clk is blocked by the AND-gates 73 and 74, respectively. In the example given, the in-phase and quadrature counter control is done independently. Upon powering up of the quadrature modulator 7, a reset signal rst resets the D-flip flops 77 and 78 so that signal generation can be initiated by the system clock clk again. In the example, as described before, where carrier leakage is measured from the output signal s(t), system clock control for in-phase and quadrature branches is done simultaneously. Then, the state machine 29 is simplified to two AND-gates and a single D-flip flop.

Figure 6:
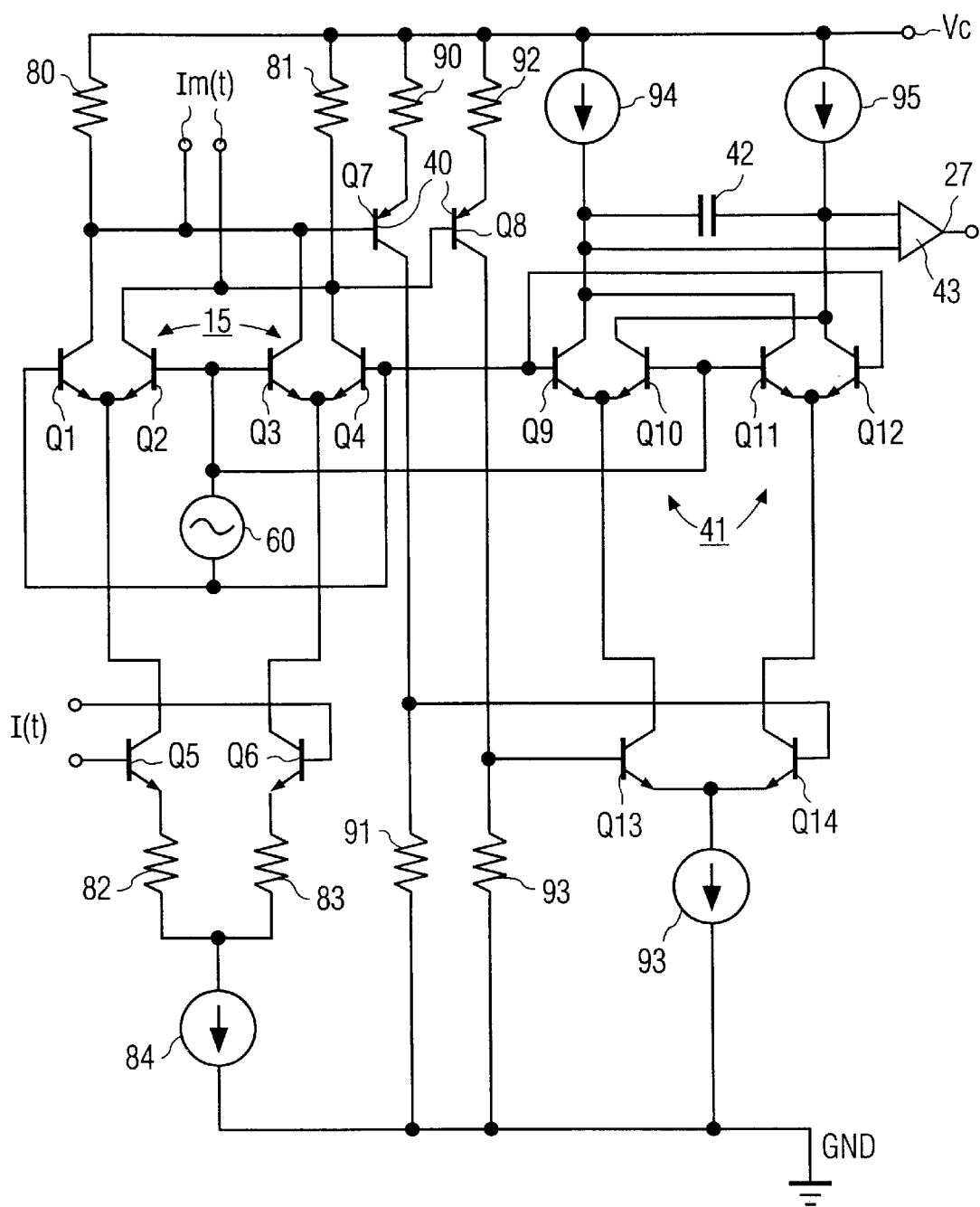
FIG. 6 shows an electronic circuit diagram of a part of a quadrature modulator according to the invention.

FIG. 6 shows an electronic circuit diagram of a part of the quadrature modulator 7 according to the invention. Shown is the first series arrangement 25 of the carrier leakage measurement means, the series arrangement of the amplifier 40, the synchronous detector 41, the filter 42, and the comparator 43, as coupled to the mixer 15, the mixer being coupled to the local oscillator 60. For the second series arrangement 26, similar electronic circuit means can be used. In the example given, all signals are differential signals. The mixer 15 is a balanced mixer comprising transistors Q1, Q2, Q3, and Q4, the signal I(t) being supplied to tail transistors Q5 and Q6 of the mixer 15. In the mixer 15, further shown are biasing resistors 80, 81, 82, and 83, and a tail current source 84. At output side, the mixer 15 is coupled to the amplifier 40, comprising transistors Q7 and Q8, the transistors Q7 and Q8 having biasing resistors 90, 91, 92, and 93. The amplifier 40 suppresses the dc-offset generated by the mixer 41. In the circuit shown, also carrier leakage being caused by capacitive coupling within the transistors Q1, Q2, Q3, and Q4 is cancelled. At output side, the amplifier 40 is coupled to the mixer 42, a synchronous detector comprised of the balanced transistors Q9, Q10, Q11, and Q12, with tail transistors Q13 and Q14, and tail current source 93, and further current sources 94 and 95 coupled to supply rail Vc. The filter 42 is embodied as a single capacitor. The filter 42 eliminates the double carrier frequency generated by the synchronous detector 41.

In view of the foregoing it will be evident to a person skilled in the art that various modifications may be made within the spirit and the scope of the invention as hereinafter defined by the appended claims and that the invention is thus not limited to the examples provided. It is to be understood that the word "comprising" in the appended claims does not exclude the presence of other elements or steps than those listed in a claim.

What is claimed is:

1. A quadrature modulator comprising:
   an in-phase modulation branch comprising a first series arrangement of a first digital-to-analog converter, a first anti-aliasing filter, a first summing means, and a first mixer;
   a quadrature modulation branch comprising a second series arrangement of a second digital-to-analog converter, a second anti-aliasing filter, a second summing means, and a second mixer;
   a local oscillator means for providing a first local oscillator signal and a second local oscillator signal to said first and second mixers, respectively;
   a third summing means coupled to respective outputs of said first and second mixers, said third summing means providing a quadrature modulated signal;
   carrier leakage measurement means for measuring a first carrier leakage signal of said first local oscillator signal in said in-phase modulation branch, and a second carrier leakage signal of said second local oscillator signal in said quadrature modulation branch;
   a controllable signal generating means for generating a first monotonously increasing signal and a second monotonously increasing signal; and
   holding means for holding values of said first and second monotonously increasing signals, said holding means being coupled to said first and second summing means so as to form feedback paths;

said carrier leakage measurement means adopting a first state in which said first and second carrier leakage signals are measured, and a second state in which said controllable signal generating means is controlled to stop generating said first and second monotonously increasing signals, said second state being adopted from said first state during measurement of said first and second carrier leakage signals.

2. A quadrature modulator as claimed in claim 1, wherein said first and second monotonously increasing signals are ramp signals.

3. A quadrature modulator as claimed in claim 1, wherein said controllable signal generator means is started to generate said first and second monotonously increasing signals upon powering up of said quadrature modulator.

4. A quadrature modulator as claimed in claim 1, wherein said local oscillator means is tunable and said controllable signal generator means is started to generate said first and second monotonously increasing signals after tuning said local oscillator means.

5. A quadrature modulator as claimed in claim 1, wherein said carrier leakage measurement means are coupled to said respective outputs of said first and second mixers.

6. A quadrature modulator as claimed in claim 1, wherein said carrier leakage measurement means comprises a first series arrangement of a first synchronous detector and a first comparator, and a second series arrangement of a second synchronous detector and a second comparator, respective output signals of said first and second comparators controlling said controllable signal generating means to stop generating said first and second monotonously increasing signals.

7. A quadrature modulator as claimed in claim 6, wherein a first filter is coupled between said first synchronous detector and said first comparator, and a second filter is coupled between said second synchronous detector and said second comparator, said first and second filters filtering double frequency components of said first and second local oscillator signals, respectively.

8. A quadrature modulator as claimed in claim 6, wherein a first amplifier is coupled between said output of said first mixer and an input of said first synchronous detector, and a second amplifier is coupled between said output of said second mixer and said second synchronous detector.

9. A quadrature modulator as claimed in claim 1, wherein said carrier leakage measurement are coupled to said in-phase and quadrature modulation branches at input side of said first and second mixers.

10. A quadrature modulator as claimed in claim 1, wherein said controllable signal generating means comprises a first counter, a second counter, and a state machine, said state machine being coupled between said carrier leakage measurement means, and said first and second counters, and said state machine feeding clock pulses to said first and second counters when said carrier leakage measurement means is in said first state, and stopping to feed clock pulses to said first and second counters when said carrier leakage measurement means is in said second state.

11. A quadrature modulator as claimed in claim 1, wherein said holding means comprises a third digital-to-analog converter for holding said value of said first monotonously increasing signal and a fourth digital-to-analog converter for holding said value of said second monotonously increasing signal.

12. A quadrature modulator as claimed in claim 1, wherein analog signals in said in-phase and quadrature modulation branches and in said carrier leakage measurement means are differential signals.

13. A radio communication device with at least transmission capability, said radio communication device comprising a transmitter with a quadrature modulator, said quadrature modulator comprising:

an in-phase modulation branch comprising a first series arrangement of a first digital-to-analog converter, a first anti-aliasing filter, a first summing means, and a first mixer;

a quadrature modulation branch comprising a second series arrangement of a second digital-to-analog converter, a second anti-aliasing filter, a second summing means, and a second mixer, a local oscillator means for providing a first local oscillator signal and a second local oscillator signal to said first and second mixers, respectively;

a third summing means coupled to respective outputs of said first and second mixers, said third summing means providing a quadrature modulated signal;

carrier leakage measurement means for measuring a first carrier leakage signal of said first local oscillator signal in said in-phase modulation branch, and a second carrier leakage signal of said second local oscillator signal in said quadrature modulation branch;

a controllable signal generating means for generating a first monotonously increasing signal and a second monotonously increasing signal; and holding means for holding values of said first and second monotonously increasing signals, said holding means being coupled to said first and second summing means so as to form feedback paths;

said carrier leakage measurement means adopting a first state in which said first and second carrier leakage signals are measured, and a second state in which said controllable signal generating means is controlled to stop generating said first and second monotonously increasing signals, said second state being adopted from said first state during measurement of said first and second carrier leakage signals.

14. A modulation method comprising:

converting a first digital signal to an analog in-phase signal;

converting a second digital signal to an analog quadrature signal;

filtering and then mixing said analog in-phase signal with a carrier signal;

filtering and then mixing said analog quadrature signal with a phase shifted version of said carrier signal;

summing said mixed analog in-phase signal and said mixed analog quadrature signal, so as to form a quadrature modulated signal;

measuring from a selection of said filtered analog in-phase signal, said filtered analog quadrature signal, said mixed analog in-phase signal, said mixed analog quadrature signal, and said quadrature modulated signal, of carrier leakage in said carrier signal;

subtracting a first monotonously increasing compensation signal from said filtered analog in-phase signal, and subtracting a second monotonously increasing compensation signal from said filtered analog quadrature signal;

determining whether said measured carrier leakage is minimal while subtracting said first and second monotonously increasing compensation signals; and stopping said subtractions when it is determined that said measured carrier leakage is minimal.

* * * * *